(12) United States Patent
Masayuki

(10) Patent No.: US 6,660,566 B2
(45) Date of Patent: Dec. 9, 2003

(54) HEAT CONDUCTIVE MOLDED BODY AND MANUFACTURING METHOD THEREOF AND SEMICONDUCTOR DEVICE

(75) Inventor: Tobita Masayuki, Tokyo (JP)

(73) Assignee: Polymatech Co., Ltd. (JP)

( * ) Notice: Subject to any disclaimer, the term of this patent is extended or adjusted under 35 U.S.C. 154(b) by 4 days.

(21) Appl. No.: 10/132,895

(22) Filed: Apr. 25, 2002

(65) Prior Publication Data

US 2002/0158332 A1 Oct. 31, 2002

Related U.S. Application Data

(62) Division of application No. 09/534,938, filed on Mar. 24, 2000.

(30) Foreign Application Priority Data

Mar. 30, 1999 (JP) .............................................. 11-87483

(51) Int. Cl.[7] .............................................. H01L 21/50
(52) U.S. Cl. ........................ 438/124; 438/118; 438/122
(58) Field of Search ........................ 438/122, FOR 413, 438/437, 902, 106–127; 257/675, 701–707, 712–722, 795, 796

(56) References Cited

U.S. PATENT DOCUMENTS 4,838,347 A * 6/1989 Dentini et al. ............... 165/185
4,996,115 A * 2/1991 Eerkes et al. ................ 428/614

* cited by examiner

Primary Examiner—Wael Fabahy
Assistant Examiner—Marcos D. Pizarro-Crespo
(74) Attorney, Agent, or Firm—McGlew and Tuttle, P.C.

(57) ABSTRACT

A heat conductive molded body effectively radiating heat generated from semiconductor elements, power supply or light source used for electric apparatuses, and a manufacturing method thereof and a semiconductor device excellent in heat radiation.

A heat conductive molded body, wherein a diamagnetic filler having a thermal conductivity of 20 W/m·K or more is orientated in a fixed direction in high polymer, a manufacturing method of the heat conductive molded body, wherein a magnetic filed is applied to high polymer composition containing the diamagnetic filler, and the diamagnetic filler contained in the composition is orientated and hardened in a fixed direction, and a semiconductor wherein said heat conductive molded body is interposed between a semiconductor element and a heat conductive member.

4 Claims, 6 Drawing Sheets

(1)

(2)

(3)

(1)

(2)

(3)

HEAT CONDUCTIVE MOLDED BODY AND MANUFACTURING METHOD THEREOF AND SEMICONDUCTOR DEVICE

This application is a divisional of application Ser. No 09/534,938, filed Mar. 24, 2000 now pending.

BACKGROUND OF THE INVENTION

1. Field of the Invention

The present invention relates to a heat conductive molded body requiring a high thermal conductivity, a manufacturing method thereof and a semiconductor device. Particularly, it relates to a heat conductive molded body effectively radiating heat generated from semiconductor elements, power supply or light source used for electric apparatuses, a manufacturing method thereof and a semiconductor device that has excellent heat radiation qualities.

2. Prior Art

Conventionally, soft sheet heat conductive molded bodies made of silicone rubber or the like have been used for conducting heat transmission between heat generating semiconductor devices or electronic components, and heat transmission members for radiating. In order to enhance the thermal conductivity, these heat conductive molded bodies are made by blending with high heat conductive metals such as silver, copper, gold, aluminum, nickel or their alloys and compounds, powder fillers made of ceramics such as aluminum oxide, magnesium oxide, silicon oxide, boron nitride, aluminum nitride, silicon nitride, silicon carbide, or power particle form or fiber form heat conductive fillers such as carbon black or diamond.

A sheet heat conductive molded body wherein graphite carbon fiber, as heat conductive filler, is blended with silicon rubber or the like is known. On the other hand, the Japanese Patent Laid-Open No. HEI 9-283955 proposes a heat radiation sheet wherein graphite carbon fiber having the average aspect ratio of less than 3 is dispersed in a matrix such as silicon rubber. As ordinary graphite carbon fiber presents the an isotropy, this invention resolves the an-isotropic thermal conductivity in thickness and in plane direction, by specifying a small aspect ratio of graphite carbon fiber and thus dispersing its fiber direction at random. However, though this method reduces the an isotropy, its thermal conductivity in the thickness direction has been insufficient. Moreover, as raw material, graphite carbon fiber having an aspect ratio of less than 3 could not always be produced easily at a low price.

On the other hand, the Japanese Patent Publication No. SHOU 50-29939 discloses a manufacturing method of a fiber reinforced complex for orientating the magnetic field using the diamagnetic anisotropy of graphite whisker or carbon fiber. The method of the present invention consists in improving the tensile strength and the elastic module of a rigid complex, namely in enhancing its mechanical strength.

Moreover, a manufacturing method wherein a high polymeric composite made of ferromagnetic material and a high polymeric substance is heat molded under a magnetic atmosphere, and its sheet molded product are known. For instance, the Japanese Patent Laid-Open No. SHOU 49-51593 discloses a basic manufacturing method for hardening a mixture of electric conductive magnetic powder and insulation material in fluid state by applying an external magnetic field. According to the Japanese Patent Laid-Open No. SHOU 53-53796, an an-isotropic electric conductive sheet can be obtained by a manufacturing method for magnetically orientating magnetic linear elements in the sheet thickness direction. The Japanese Patent Publication No. HEI 4-74804 relates to an an-isotropic electric conductive rubber sheet of specific hardness and specific thickness wherein an unhardened complex containing, as major constituents, electric conductive ferromagnetic particle of specific particle diameter and insulate high-polymer .elastic element, is magnetically treated and cross-linked.

However, any of molded bodies obtained by these conventional methods using the magnetic field does not intend to improve the thermal conductivity, and they have been applied mainly to the high strength complex, an-isotropic electric conductive pieces or pressure-sensitive electric conductive pieces.

In other words, various problems such as electrochemical migration acceleration, wiring or pad portion corrosion acceleration provoked by large heat generation from electronic components including semiconductor devices, component material cracking or destruction provoked by the thermal stress, and damaging of the electronic component reliability or life by peeling of the interface of component material junctions, have been occurring, because heat conductive molded bodies presenting a good thermal conductivity in any direction such as thickness direction or plane inside direction have not been developed.

EMBODIMENTS OF THE INVENTION

In order to resolve problems mentioned above, the present invention presents a heat conductive molded body effectively radiating heat generated from semiconductor devices, a power supply, a light source or other components used for electric apparatuses, a manufacturing method thereof and a semiconductor device that has excellent heat radiation qualities.

In other words, the present invention relates to a heat conductive molded body, wherein a diamagnetic filler having a thermal conductivity of 20 W/m·K or more is orientated in a fixed direction in high polymer.

In addition, it relates to a manufacturing method of the heat conductive molded body, wherein a magnetic field is applied to high polymer composition containing the diamagnetic filler having a thermal conductivity of 20 W/m·K or more, and a diamagnetic filler contained in the composition is orientated and hardened in a fixed direction.

Another invention relates to a semiconductor device, wherein a heat conductive molded body, composed by orientating a diamagnetic filler having a thermal conductivity of 20W/m, K or more in a fixed direction in high polymer, is interposed between a semiconductor elements and a heat conductive member. The diamagnetic filler means a filler of negative specific magnetic susceptibility, namely a filler whose magnetism is magnetized in a direction opposite to the magnetic field when a magnetic field is applied. To be more specific, there are bismuth, copper, gold, silver, mercury, quartz and their alloys or compounds, water, graphite, carbon fiber, salts, and many organic compounds. Among metals, it is known that bismuth presents the maximum diamagnetism; however, it is not preferable as diamagnetic filler used for the present invention, because bismuth thermal conductivity is less than 20W/m*K. Water, salts and organic compounds are also inappropriate.

The diamagnetism of diamagnetic filler is very weak compared to the magnetism of ferromagnetic material; however, the heat conductive molded body and semiconductor device of the present invention are characterized by that a diamagnetic filler having a thermal conductivity of 20 W/m° K. or more is orientated in a fixed direction in high polymer. As diamagnetic filler having a thermal conductivity of 20 W/m·K or more, especially copper, gold, silver, mercury and graphite are preferable. Among them, the use of a graphite having a thermal conductivity of 200 W/m·K or more at least in a fixed direction makes it possible to obtain an excellent heat conductive molded body having an especially high thermal conductivity and a semiconductor device excellent in heat radiation characteristics.

The diamagnetic filler having a thermal conductivity of 20 W/m·K or more, when filled abundantly in high polymer matrix and orientated in a fixed direction, increases the high heat conductivity of the diamagnetic filler orientated in the heat conductive molded body in the orientated direction. However, in practice, such abundant filling may provoke the increasing of the compound viscosity excessively, or the difficulty to eliminate mixed bubbles. At higher levels of the compound viscosity, it is more difficult to orientate the diamagnetic filler.

Consequently, though it can be decided arbitrarily according to the nature of diamagnetic filler and high polymer matrix or compounding agents to be used, and the characteristics of the intended final product, the concentration of diamagnetic filler in the heat conductive molded body is preferably 5 to 80% in volume. If the concentration is less than 5% in volume, the thermal conductivity becomes smaller, and if it exceeds 80% in volume, it becomes extremely difficult to fill with a high concentration. The practical range is preferably 10 to 60% in volume, and more preferably 15 to 50% in volume.

The crystal structure of graphite used as diamagnetic material is a hexagonal system, presenting a higher magnetic susceptibility according to the crystal orientation. Supposing c axis be normal to the basic face (face c), and a axis and b axis are vertical to the same, the magnetic susceptibility at the ambient temperature presents a difference of about 70 times. Using this anisotropy of the diamagnetic magnetic susceptibility, graphite can be orientated in a fixed direction in high polymer.

The graphite shape or size is not specified. As for raw material, carbon fiber having a developed graphite structure, obtained by fusion spinning, infusible treatment and carbonization of pitch base or mesophase pitch base as main material, and then having a high temperature heat treatment of 2000 to 3000° C. or more than 3000° C., is preferable because it presents a higher thermal conductivity in the fiber longitudinal direction. Moreover, graphite carbon fiber obtained by a vapor phase growth process, well-known graphite film obtained by a high temperature heat treatment of 2400° C. or more of high polymer film such as dilative graphite or polyimide, or powder particle form graphite obtained by crushing graphite film, spherical or whisker form graphite can also be used.

The thermal conductivity of graphite to be used is preferably 200 W/m·K or more at least in one direction. If it is less than 200 W/m·K, the heat radiation characterisitic of the obtained heat conductive molded body is decreased disadvantageously. As for graphite carbon fiber, ordinarily, the thermal conductivity is higher in the fiber longitudinal direction, while in the vertical direction, it is lower, one tenth of the same. An appropriate thermal conductivity in the fiber longitudinal direction is 200 W/m·K or more, preferably 400 W/m·K or more, and more preferably 800 W/m·K or more.

In case of graphite carbon fiber, the average diameter range of 5~20 μm, and the average length range of 5~800 μm are preferable, because these ranges allow to fill easily in the polymer matrix, and to increase the thermal conductivity of the heat conductive molded body to be obtained. If the average diameter is smaller than 5 μm or the average length is longer than 800 μm, it becomes difficult to blend into the high polymer matrix with a high concentration. Moreover, a graphite carbon fiber having the average diameter exceeding 20 μm is not preferable, because its productivity decreases. If the average length is less than 5 μm, its bulk specific gravity decreases, and may cause problems in productivity, handling or workability during the manufacturing process.

These graphites may well be allowed in advance to apply a known oxidation treatment by electrolytic oxidation or the like.

The nature of high polymers serving as matrix for orientating a diamagnetic filler having a thermal conductivity of 20 W/m° K. or more is not limited especially. According the hardness, mechanical strength, heat strength, electric properties, durability, reliability or other required performances of the intended heat conductive molded body, thermoplastic resins, thermoplastic elastomers, thermosetting resins, cross-linking rubbers can be selected. If the diamagnetic filler is to be filled at a high concentration, the high polymer to be used presents preferably a low viscosity at the liquid or fused state.

Thermoplastic resins and thermoplastic elastomers include polyethylene, polypropylene, ethylene propylene copolymer or other ethylene α olefin copolymers, polymethylpentene, PVC, polyvinylidene chloride, polyvinyl acetate, ethylene vinyl acetate copolymer, polyvinyl alcohol, polyvinyl acetal, polyvinylidene fluoride, polytetrafluoroethylene or other fluorocarbon resins, polyethylene terephthalate, polybutylene terephthalate, polyethylene naphthalate, polystyrene, polyacrylonitrile, styreneacrylonitrile copolymer, ABS resin, polyphenylene ether, denatured PPE resin, aliphatic and aromatic polyamides, polyimide, polyamide imide, polymethacrylic acid, its methyl ester or other polymethacrylic acid esters, polyacrylic acid, polycarbonate, polyphenylene sulfide, polysulfone, polyethersulfones polyetherketone, polyketone, liquid crystal polymer, silicone resin, ionomer or other thermoplastic resins, styrene-butadiene or styrene-isopropylene block copolymer and its hydogenated polymer and styrene base thermoplastic elastomer, olefin base thermoplastic elastomer, PVC base thermoplastic elastomer, polyester base thermoplastic elastomer, polyurethane base thermoplastic elastomer, polyamide base thermoplastic elastomer, and other thermoplastic elastomers.

Thermosetting resins and cross-linking rubbers include epoxy resin, polyimide resin, bysmaleymide resin benzocyclobutene resin, phenol resin, unsaturated polyester resin, diallyl phthalate resin, silicone resin, urethane resin, thermosetting polyphenylene ether and denatured PPE resin, natural rubbers butadiene rubber, isoprene rubber, styrene butadiene copolymer rubber, nitrile rubber, hydogenated nitrile rubber, chloroprene rubber, ethylene propylene rubber, chlorinated polyethylene, chlorosufonated polyetylene, butyl rubber and halide butyl rubbers fluorine rubbers urethane rubbers silicon rubber and other cross-linked rubbers.

In particular, the use of at least one selected from a group including silicon rubber, epoxy resin, polyimide resin, bysmaleymide resin, benzocyclobutene resins fluorine resin, polyphenylene ether resin, especially the use of at least one selected from a group including silicon rubber, epoxy resin, polyimide resin is preferable from the viewpoint of reliability.

Moreover, these material resins present preferably a low viscosity in the liquid or fused state, because this can be allowed to dissipate and blend easily, when a diamagnetic material is mixed. If the application requires low dielectric constant and dielectric loss tangent, and frequency characteristics in the high frequency range, fluorine resin, thermosetting polyphenylene ether resin, denatured PPE resin, or polyolefin base resin can be used advantageously.

Here, a polymer alloy composed of a plurality of resins selected from these resins may also be used. The cross-linking method is not limited to the thermosetting, resins obtained by radiation curing, hygrosetting or other known cross-linkage methods can be used.

For the heat conductive molded body of the present invention, a small amount of filler in spherical, powder, fiber, needle, scale or whisker form, composed of aluminum oxide, boron nitride, aluminum nitride, zinc oxide, silicon carbide, aluminum hydroxide or other metal oxides, metal nitrides, metal carbonates, metal hydroxides or other metals or alloys presenting a high thermal conductivity can be used at the same time as other heat conductive filler.

In view of surface treatment of the diamagnetic filler, it is possible to enhance the wettability with matrix high polymer or fillability, or to improve the surface peeling strength, by treating the diamagnetic filler surface with publicly known coupling agent or sizing agent.

As raw material composition of the heat conductive molded body of the present invention, powder or fiber form metals or ceramics, to be specific, silver, copper, gold, aluminum oxide, magnesium oxide, aluminum nitride, silicon carbide or metal coated resins, or other fillers used for the conventional heat conductive molded bodies can be used at the same time. It is effective to add a volatile organic solvent or a reactive plasticizer in order to reduce the composition viscosity.

The hardness of the hardened heat conductive molded body may be decided according to the domain of use; however, soft low hardness is more advantageous as for the stress relaxation and tracking ability. To be specific, low hardness products presenting 90 or less in Shore A hardness, preferably 60 or less are appropriate. Gel form low hardness products of 30 or less in asker C hardness is preferable, if it is to be interposed between a plurality of uneven electronic components such as semiconductor device as shown in FIG. 4 and a heat conductive member.

In order to orientate a diamagnetic filler having a thermal conductivity of 20 W/m° K. or more in a fixed direction in the high polymer, a method using a fluid field or shearing field, a method using a magnetic field, or a method using an electric field can be used. Any method is effective to orientate a diamagnetic filler having a thermal conductivity of 20 W/m° K. or more in a fixed direction. However, in the present invention, it is preferable to orientate by the magnetic field, taking profit of the an-isotropic magnetic susceptibility of the diamagnetic material. The manufacturing method according to the present invention makes it possible to manufacture easily using various matrix high polymer.

The manufacturing method of the heat conductive molded body of the present invention comprises the steps of applying a magnetic field to high polymer composition containing diamagnetic filler, and orientating and hardening the diamagnetic filler in the composition in a fixed direction. The application of external magnetic field makes it possible to orientate sufficiently the diamagnetic filler in the composition along the magnetic line of force, so as to improve remarkably the thermal conductivity in the same direction of the heat conductive molded body formed taking profit of the thermal conductivity of the orientated diamagnetic filler. In order to orientate the diamagnetic filler aligned vertically to the thickness direction of the heat conductive molded body, it is so arranged so that the direction of the magnetic line of force corresponds to the desired diamagnetic filler orientation direction, by opposing the N pole and the S pole of permanent magnets or electromagnets in the thickness direction.

On the other hand, in order to improve the fixed direction thermal conductivity in the longitudinal and transversal directions, or in the orthogonal horizontal directions in a plane of the heat conductive molded body, the diamagnetic filler can be aligned to orientate in a direction in the plane, by opposing magnet N pole and S pole in a direction vertical to the thickness direction. Also, the diamagnetic filler can be aligned in a direction in the plane, by opposing magnet N pole and N pole, or S pole and S pole in the thickness direction. Namely, it becomes possible to afford the anisotropy of thermal conductivity in any direction. Moreover, magnets are not necessarily opposed in both sides; however, magnets arranged only on one side can well orientate the diamagnetic filler contained in the raw material composition.

The magnetic field generation means used as external magnetic field may be a permanent magnet, an electromagnet or a coil, presenting a magnetic flux density of 0.05 to 30 terrace may practically orientate the diamagnetic filler. As a very weak diamagnetism in magnetism is used in the present invention, it is necessary to use a higher magnetic field to orientate the diamagnetic filler, before hardening matrix high polymer by thermosetting reaction or cooling.

The heat conductive molded body of the present invention can be produced by applying a magnetic field to high polymer composition containing diamagnetic filler having a thermal conductivity of 20 W/m·K, and orientating the diamagnetic filler in the composition in a fixed direction, and then hardening. It is preferable to eliminate mixed bubbles by reducing or increasing the pressure, during the blending and dissipation process.

The use of graphite as diamagnetic filler may result in conductivity to the heat conductive molded body obtained. If the intended application requires the electric insulation, a diamagnetic filler coated with an electric insulating coating film may be applied to the uppermost surface of the diamagnetic filler, as mentioned above.

Moreover, a structure including a polyimide, silicon, polybenzocyclobutene, polybutadiene or other high polymer base electric insulating layer, or a silicon oxide, silicone nitride, aluminum oxide, aluminum nitride, silicon carbide or other ceramics base electric insulating layer, laminated on at least one surface of the heat conductive molded body can be applied to an usage requiring the electric insulation. As for the high polymer base electric insulating layer to be formed in this process, a high heat conductive and electric insulating layer comprising fillers of high thermal conductivity such as aluminum oxide, magnesium oxide, aluminum nitride or silicon carbide is preferable.

A semiconductor device that has the excellent heat radiation qualities of the present invention, illustrated in FIG. 1 to FIG. 4 can be manufactured by interposing a sheet heat conductive molded body 3 of the present invention between a heat generating semiconductor element 2, 6 and a heat conductive member 4, a printed circuit board 1, a heat sink 5, a case 7 or the like. Heat conductive members include ordinary radiators and coolers, heat sinks, heat spreaders, die pads, printed circuit boards, cooling fans, heat pipes, cases or the like.

EXAMPLE 1

Figure 5:
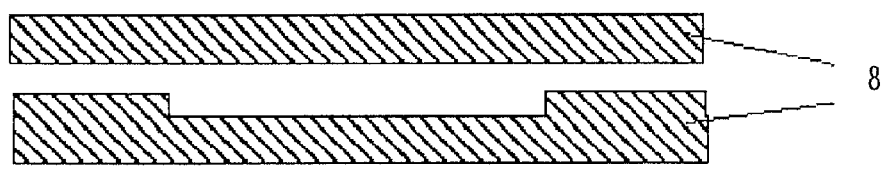
FIG. 5 is a drawing showing an example of manufacturing method of heat conductive molded body of the present invention.
Figure 5:
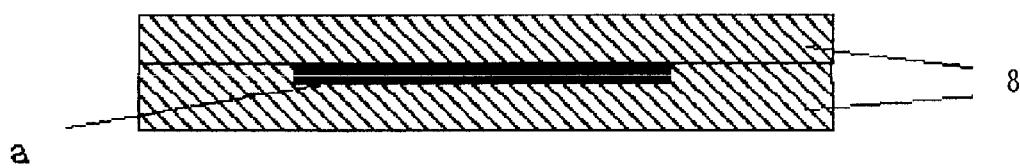
Figure 5:
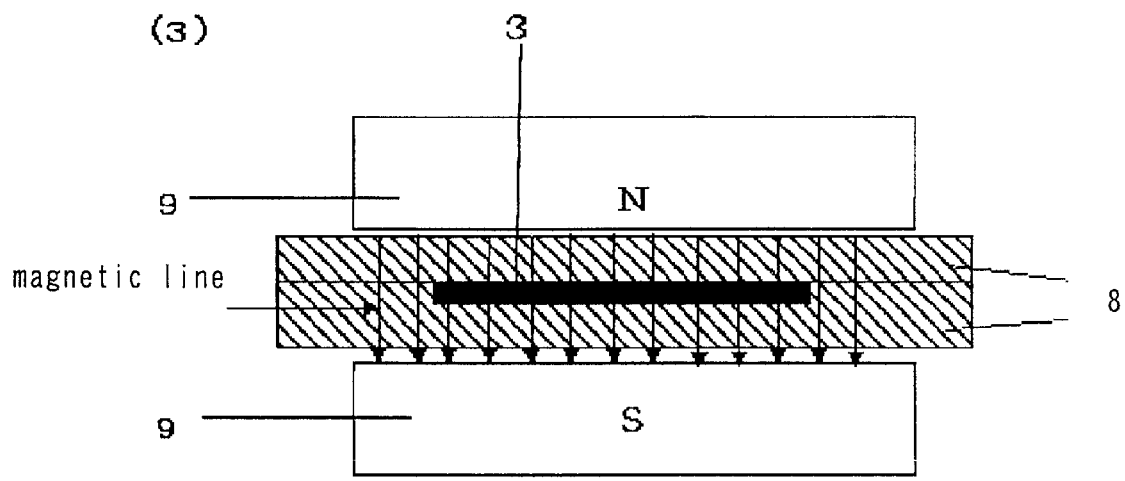

As diamagnetic filler, a composition is prepared by blending and dissipating 25% in volume of short fiber form graphite presenting a thermal conductivity of 1000 W/m° K. in the fiber longitudinal direction (Merbronmild, made by Petoca Co., Ltd. diameter 94 m, length 100 µm) and 75% in volume of additional type liquid silicon rubber material, and eliminating bubbles in a vacuum. A plate mold 8 of aluminum, 0.5 mm in thickness, 20 mm' in length, and 20 mm in width, is filled with the prepared composition, a graphite is orientated sufficiently in a magnetic field atmosphere where the N pole and the S pole of a magnet 9 of 0.5 terrace in magnetic flux density are opposed in the thickness direction as shown in FIG. 5 (1) to FIG. 5 (2) and FIG. 5 (3), then heat hardened to obtain a soft sheet heat conductive molded body 3 of 20 in Shore A-hardness.

Figure 7:
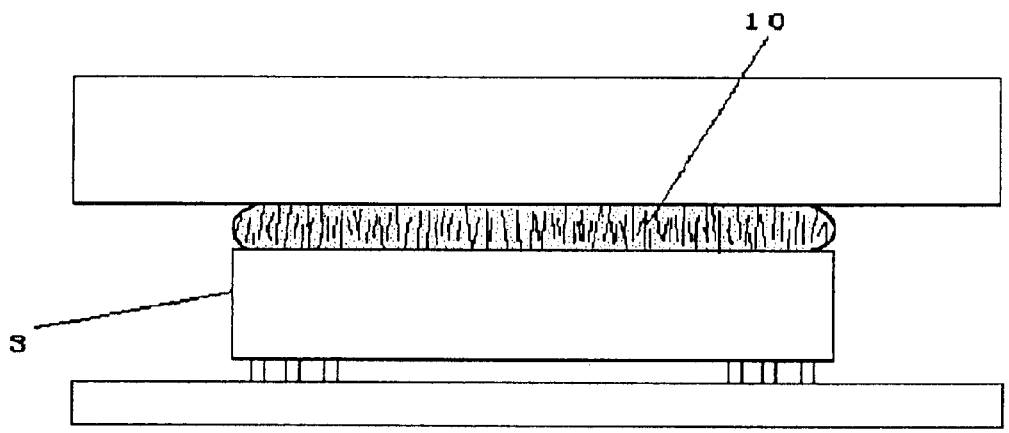
FIG. 7 is a schematic diagram showing the orientation of diamagnetic filler in the heat conductive molded body of the present invention (diamagnetic filler orientated in the thickness direction)

The thickness direction and the plane inside direction thermal conductivity of the obtained sheet heat conductive molded body 3 were respectively 3.6 W/m° K. and 0.8W/m° K. Graphite of heat conductive molded body was aligned to orientate to the thickness direction as shown in FIG. 7.

EXAMPLE 2

Figure 6:
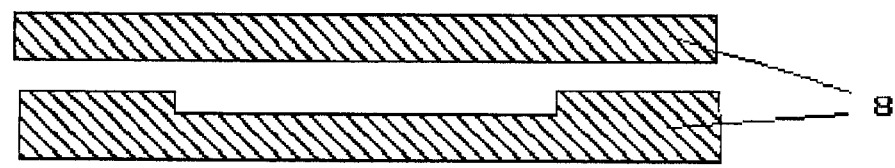
FIG. 6 is a drawing showing an example of another manufacturing method of heat conductive molded body of the present invention.
Figure 6:
Figure 6:
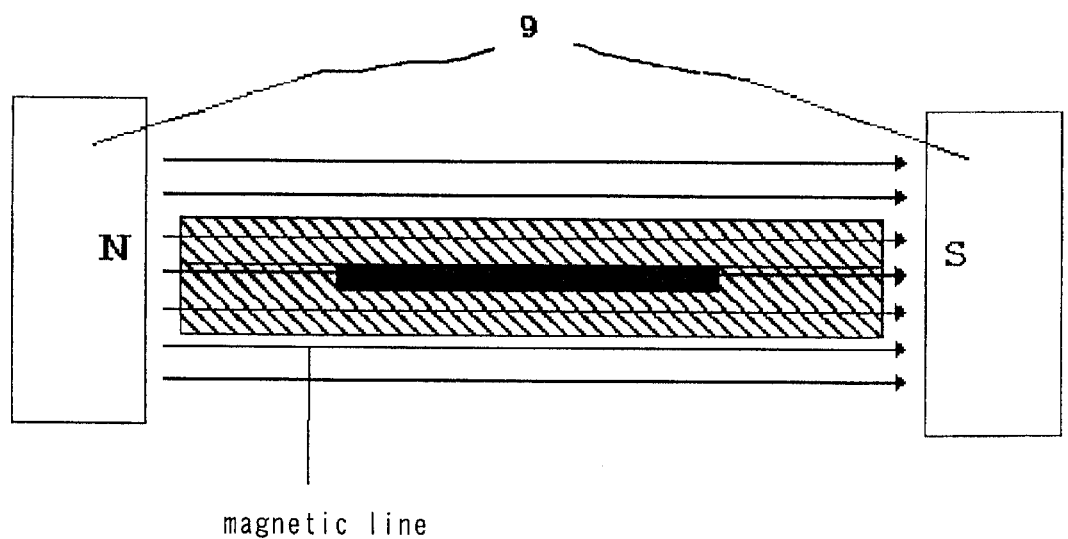

The similar composition to the Example 1 is prepared, and filled into an aluminum plate mold of 0.5 mm in thickness, 20 mm in length, and 20 mm in width, graphite is orientated sufficiently in a magnetic field atmosphere of 0.5 terrace in magnetic flux density where the N pole and the S pole of the magnet 9 are opposed in a direction vertical to the thickness as shown in FIG. 6 (1) to FIG. 6 (2) and FIG. 6 (3), then heat hardened to obtain a soft sheet heat conductive molded body of 18 in Shore A-hardness.

Figure 8:
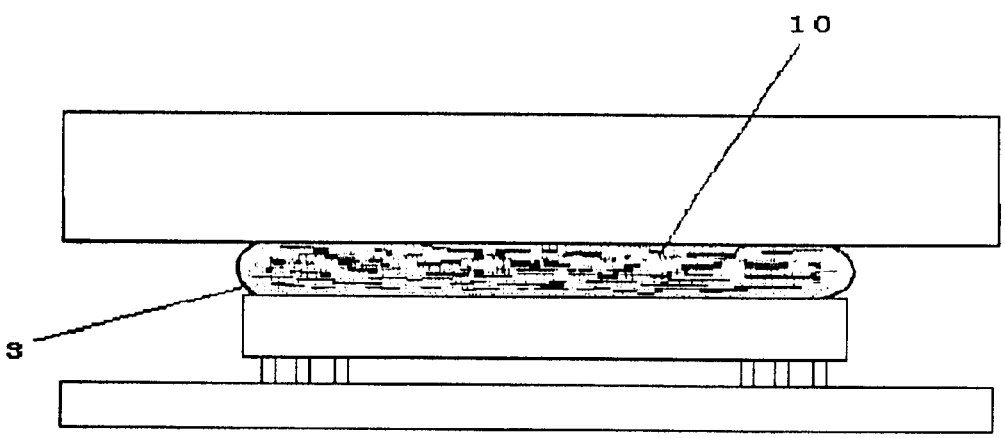
FIG. 8 is a schematic diagram showing the orientation of diamagnetic filler in the heat conductive molded body at the present invention (diamagnetic filler orientated in the plane direction)

The thickness direction and the plane inside direction thermal conductivity of the obtained sheet heat conductive molded body were respectively 1.0 W/m° K. and 3.4 W/m° K. The graphite 10 of heat conductive molded body 3 was aligned to orientate to the plane inside direction as shown in FIG. 8.

EXAMPLE 3

As in the Example 1, as diamagnetic filler, a composition is prepared by blending and dissipating 20% in volume of short fiber form graphite presenting a thermal conductivity of 1000 W/m·K in the fiber longitudinal direction (Merbronmild, made by Petoca Co., Ltd.: diameter 9 µm, length 100 µm) and 80% in volume of thermosetting single liquid epoxy resin (TB2280C, made by Three Bond Co., Ltd. ), and eliminating bubbles in a vacuum. A plate mold of aluminum, 0.5 mm in thickness, 20 mm in length, and 20 mm in width, is filled with the prepared composition, graphite is orientated sufficiently in a magnetic field of Table 2 where the N pole and the S pole of the magnet 9 are opposed in the thickness direction or in the vertical direction thereof, then heat hardened.

The thickness direction and the plane inside direction thermal conductivity of the obtained hard sheet heat conductive molded body 3 were respectively 3.2 W/m·K and 0.6 W/m° K. The graphite 10 of the heat conductive molded body was aligned to orientate to the thickness direction as shown in FIG. 7.

The thickness direction and the plane inside direction thermal conductivity of the obtained hard sheet heat conductive molded body were respectively 3.2 W/m·K and 0.6 W/m·K. Graphite of heat conductive molded body was aligned to orientate to the thickness direction as shown in FIG. 7.

EXAMPLE 4

As diamagnetic filler, a composition is prepared by blending and dissipating 20% in volume of copper short wire presenting a thermal conductivity of 398/m·K (diameter 50 µm, length 200 µm) and 80% in volume of thermosetting single liquid epoxy resin (TB2280C, made by Three Bond Co., Ltd.), and eliminating bubbles in a vacuum. A plate mold of aluminum, 0.5 mm in thickness, 20 mm in length, and 20 mm in width, is filled with the prepared composition, copper wires are orientated sufficiently in a magnetic field where the N pole and the S pole of 1.5 terrace in magnetic flux density are opposed in the thickness direction, then heat hardened.

The thickness direction and the plane inside direction thermal conductivity of the obtained hard sheet heat conductive molded body were 3 respectively 2.4 W/m° K. and 0.46 W/m° K. Copper wires in the heat conductive molded body were aligned to orientate to the thickness direction as shown in FIG. 7.

As diamagnetic filler, a composition is prepared by blending and dissipating 25% in volume of carbon fiber presenting a thermal conductivity of 7 mW/m° K. in the fiber longitudinal direction (Pyrofil, made by Mitsubishi Rayon Co., Ltd. diameter 7 µm, length 1004 m) and 75% in volume of additional type liquid silicon rubber material, and eliminating bubbles in a vacuum. A plate mold of aluminum, 0.5 mm in thickness, 20 mm in length, and 20 mm in width, is filled with the prepared composition, which is heat hardened in a magnetic field atmosphere where the N pole and the S pole of 0.5 terrace in magnetic flux density are opposed in the thickness direction as shown in FIG. 5-1 to FIG. 5-2 and FIG. 5-3, to obtain a soft sheet heat conductive molded body 3 of 20 in Shore A-hardness.

The thickness direction and the plane inside direction thermal conductivity of the obtained sheet heat conductive molded body 3 were respectively 0.2 m W/m° K. and 0.2 m W/m° K. The graphite 10 in the sheet was aligned to orientate to the thickness direction as shown in FIG. 7.

Comparative Example 2

As diamagnetic filler, a composition is prepared by blending and dissipating 20% in volume of short fiber form graphite presenting a thermal conductivity of 1000 W/m, Kin the fiber longitudinal direction (Merbronmild, made by Petoca Co., Ltd. diameter 9 $\mu$m, length 100 $\mu$m) and 80 % in volume of additional type liquid silicon rubber material, and eliminating bubbles in a vacuum. A plate mold of aluminum, 0.5 mm in thickness, 20 mm in length, and 20 mm in width, is filled with the prepared composition, which was heat hardened without applying the magnetic field, to obtain a soft sheet heat conductive molded body 12 of 12 in Shore A-hardness.

Figure 9:
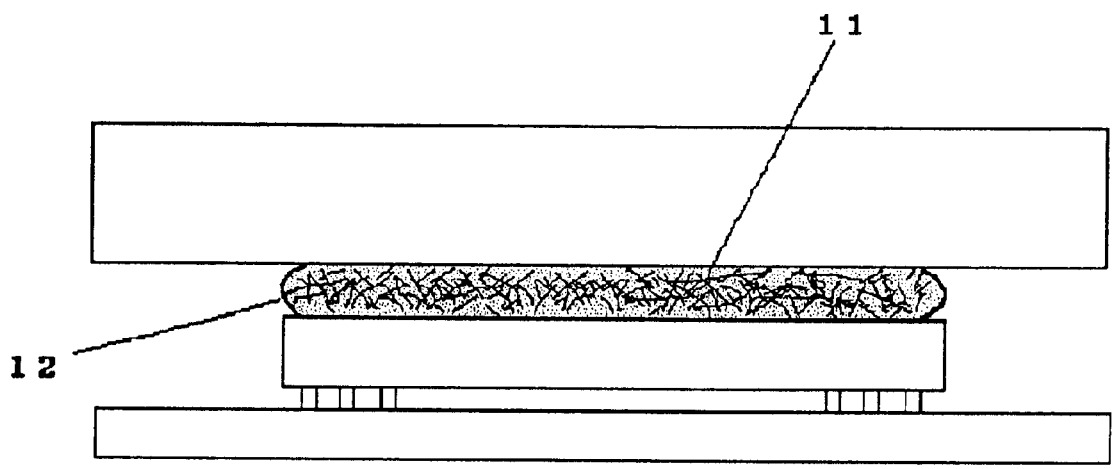
FIG. 9 is a schematic diagram showing the dissipation of diamagnetic filler in a molded body containing a conventional filler.

The thickness direction and the plane inside direction thermal conductivity of the obtained sheet heat conductive molded body 12 were respectively 0.2 W/m° K. and 0.3 W/m° K. The graphite 11 in the sheet was dissipated at random as shown in FIG. 9.

Comparative Example 3

Similarly to the Example 3, as diamagnetic filler, a composition is prepared by blending and dissipating 15 % in volume of short fiber form graphite presenting a thermal conductivity of 1000 W/mKin the fiber longitudinal direction (Merbronmild, made by Petoca Co., Ltd.,: diameter 9 $\mu$m, length 100 $\mu$m) and 85 % in volume of thermosetting single liquid epoxy resin (TB2280C, made by Three Bond Col., Ltd.), and eliminating bubbles in a vacuum. A plate mold of aluminum, 0.5 mm in thickness, 20 mm in length, and 20 mm in width, is filled with the prepared composition, which was heat hardened without applying the magnetic field, to obtain a soft sheet heat conductive molded body 12 of 12 in Shore A-hardness.

The thickness direction and the plane inside direction thermal conductivity of the obtained sheet heat conductive molded body 12 were respectively 0.3 W/m° K. and 0.4 W/m° K. The graphite in the sheet was dissipated at random as shown in FIG. 9.

Figure 1:
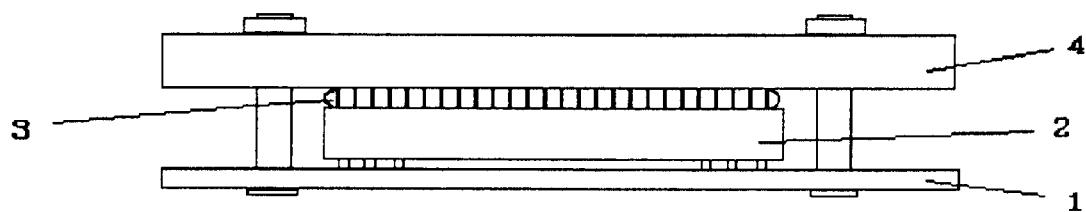
FIG. 1 is an example of semiconductor device using a sheet heat conductive molded body of the present invention (disposed between a ball grid array type semiconductor package 2 and a heat radiator 4)
Figure 2:
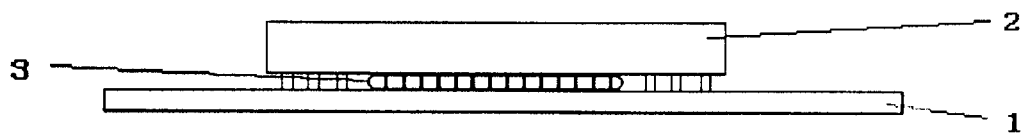
FIG. 2 is an example of semiconductor device using a sheet heat conductive molded body of the present invention (disposed between a chip size semiconductor package 2 and a printed circuit board 1)
Figure 3:
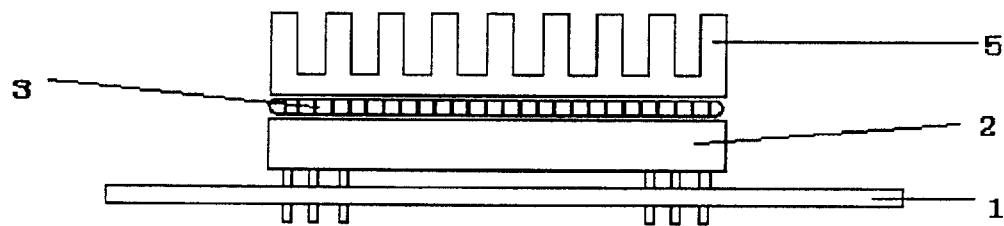
FIG. 3 is an example of semiconductor device using a sheet heat conductive molded body of the present invention (disposed between a pin grid array type semiconductor package 2 and a heat sink 5)
Figure 4:
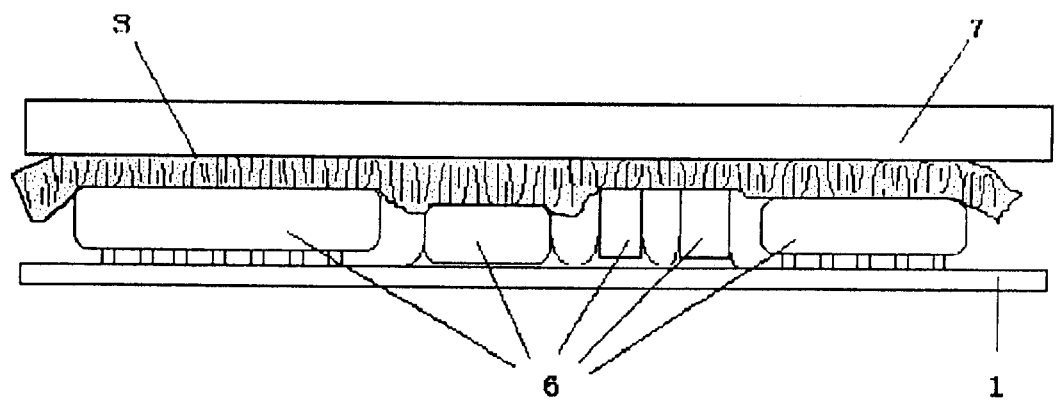
FIG. 4 is an example of semiconductor device using a sheet heat conductive molded body of the present invention (disposed between a plurality of heat generating semiconductor device 6 and a case 7)

A semiconductor device is assembled by interposing a sheet heat conductive molded body 3 of 2 mm in thickness, similar to the Example 1 of the present invention, and, between a plurality of semiconductor elements 6 of different height mounted on a printed circuit board 1 shown in FIG. 4 and the case 7 of the heat transmission member. The heat strength value at 10 min. after turning on electricity is measured, to obtain 0.250 C/W.

Similarly, a semiconductor device is assembled by disposing a sheet heat conductive molded body of 2 mm in thickness. At 10 min after turning on electricity, the heat strength value is measured, to obtain 0.47° C./W.

Effect of the Invention

In the Comparative Example 1, the molded body is obtained by the magnetic field orientation of carbon fiber presenting a thermal conductivity less than 20 W/m·K as diamagnetic filler in silicon rubber, and presents a good flexibility but a low thermal conductivity. In the Comparative Example 2 and the Comparative Example 3, the molded body is obtained using carbon fiber presenting a thermal conductivity of 1000 W/m·K as diamagnetic filler; however, it presents a low thermal conductivity, because it is molded without magnetic field application.

The heat conductive molded body according to the Example 1 and the Example 2 of the present invention is a heat conductive molded body, wherein, as diamagnetic filler, short fiber form graphite presenting a thermal conductivity of 1000 W/m·K is used and orientated sufficiently by the magnetic field in silicon rubber, and presents a good flexibility and a high thermal conductivity in the thickness direction or in the plane inside direction. In the Example 3, epoxy resin is used as high polymer, and in the Example 4, short copper wire is used as diamagnetic filler.

As described hereinbefore, the manufacturing method of heat conductive molded body allows to produce easily a heat conductive molded body of excellent thermal conductivity. In particular, a semiconductor device using a sheet heat conductive molded body wherein diamagnetic filler of a specific thermal conductivity is orientated in the thickness direction provides a low heat strength and an excellent heat radiation. Consequently, a useful semiconductor device of good heat radiation can be provided by interposing in a gap between a semiconductor element of high heating value and a heat radiator such as a heat sink, a case, or other radiators, or in a gap between the semiconductor element and a printed circuit board or a die pad.

What is claimed is:

1. A manufacturing method of a heat conductive molded body, wherein a magnetic field is applied to a high polymer composition containing a diamagnetic filler having a thermal conductivity of 20 W/m° K or more, and the diamagnetic filler contained in the composition being orientated in a fixed direction by application of the magnetic field and hardened in the fixed direction and the diamagnetic filler is graphite having a thermal conductivity of 200 W/m° K or more at least in one direction.

2. The manufacturing method of the heat conductive molded body of claim 1, wherein the high polymer is selected from the group consisting of silicone rubber, epoxy resin and polymide resin.

3. The manufacturing method of the heat conductive molded body of claim 1, wherein the concentration of diamagnetic filler in the heat conductive molded body is 5–80% in volume.

4. The manufacturing method of the heat conductive molded body of claim 3, wherein the high polymer is selected from the group consisting of silicone rubber, epoxy resin and polymide resin.

* * * * *